United States Patent
Gopikuttan Nair

(10) Patent No.: US 6,295,239 B1
(45) Date of Patent: Sep. 25, 2001

(54) CONTROL APPARATUS FOR TESTING A RANDOM ACCESS MEMORY

(75) Inventor: Vinod Nair Gopikuttan Nair, Singapore (SG)

(73) Assignee: Infineon Technologies A.G., Munch (DE)

( * ) Notice: Subject to any disclaimer, the term of this patent is extended or adjusted under 35 U.S.C. 154(b) by 0 days.

(21) Appl. No.: 09/649,125

(22) Filed: Aug. 28, 2000

(51) Int. Cl.<sup>7</sup> ....................................... G11C 7/00
(52) U.S. Cl. ........................................ 365/201; 714/718
(58) Field of Search .................. 365/201; 714/718, 714/733

(56) References Cited

U.S. PATENT DOCUMENTS 6,009,028 * 12/1999 Akiyama ............................... 365/201
6,151,692 * 11/2000 Smitlener et al. .................... 714/718

* cited by examiner

Primary Examiner—Vu A. Le
(74) Attorney, Agent, or Firm—Senniger, Powers, Leavitt & Roedel

(57) ABSTRACT

A logic device includes a RAM and control apparatus (10). The control apparatus (10) is adapted to receive input signals (6) from a processor and the control apparatus (10) is also adapted to be coupled to the RAM to send signals to the RAM in response to the input signals (6). The control apparatus (10) includes a data generator (3) and the data generator generates a test bit pattern which is dependent on the received input signals (6).

9 Claims, 1 Drawing Sheet

RAM Test Controller

RAM Test Controller

CONTROL APPARATUS FOR TESTING A RANDOM ACCESS MEMORY

Figure 1:
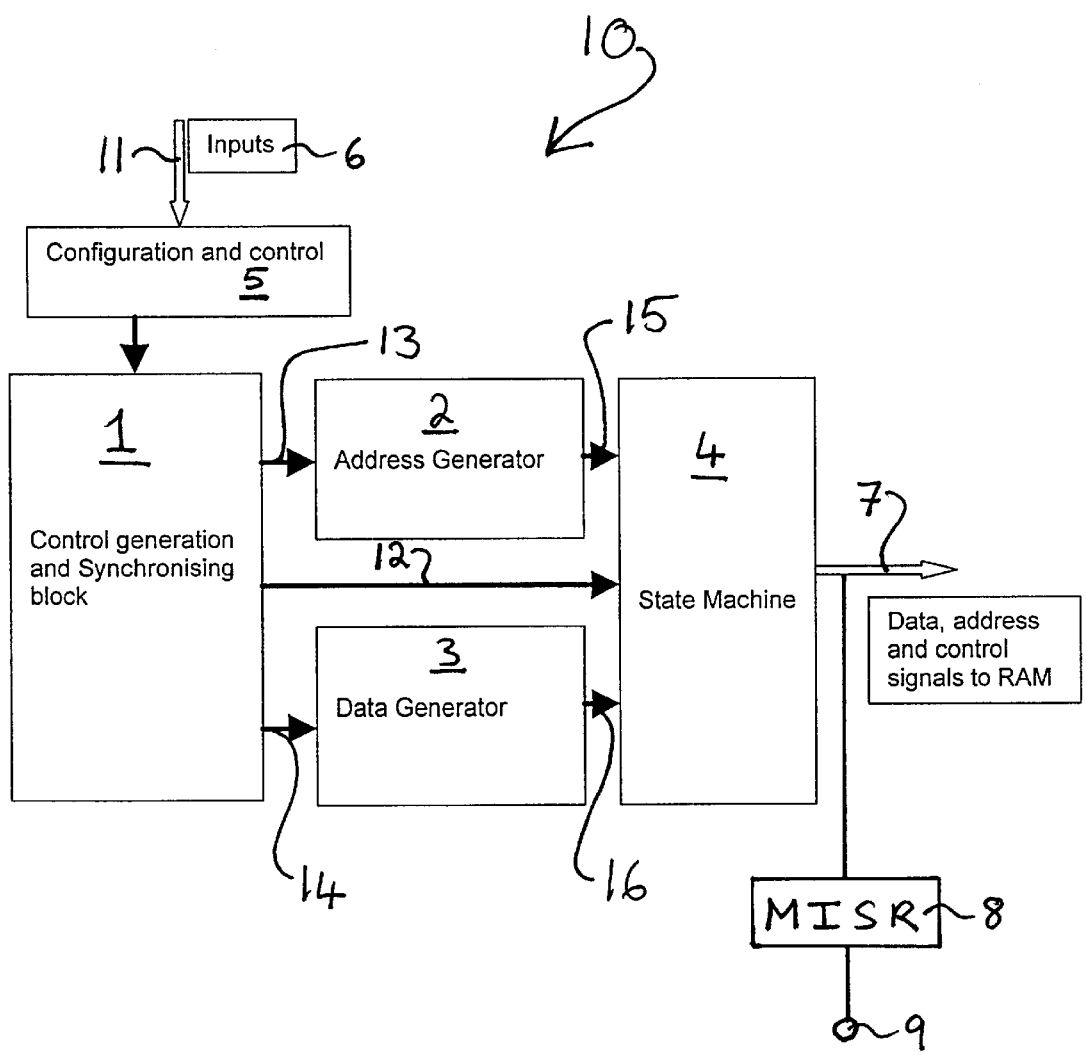

The invention relates to control apparatus for testing a random access memory (RAM), and in particular, a RAM on a logic device.

Conventionally, there are a number ways of testing a RAM on a logic device. For example, it is possible to use a microcontroller, or other processor, on the logic device to test the RAM using a suitable test program.

Another method of testing is to use what is commonly known as built-in self test (BIST). This is implemented by building test logic onto the logic device. The only function of the test logic is to test the RAM.

However, with BIST, in order to generate the test algorithm, which is permanently stored in the test logic, it is essential to know the internal structure of the RAM to efficiently and comprehensively test the RAM. It is only possible to choose an appropriate test bit pattern to properly test the RAM if the internal structure of the RAM is known. The test bit pattern is fixed into the test logic on the logic device and therefore, cannot be altered. Hence, it is essential when designing the logic device to be able to generate the optimum test algorithm and test bit pattern using the test logic as there is no flexibility to be able to change the test algorithm or the test bit pattern after the logic device has been fabricated.

One of the problems with determining the internal structure of the RAM is that as the RAM is usually supplied by another manufacturer and then built onto the logic device, the internal structure of the RAM is generally not known. Therefore, it can be difficult or impossible to generate the optimum test algorithm and test bit pattern to build into the test logic to test the RAM.

In accordance with the present invention, control apparatus for testing a RAM comprises a control device coupled to an address generator, a data generator and a state machine, the state machine receiving outputs from the address generator, the data generator and the control device, and in response to the received outputs, outputting data, address and control signals, and a control interface coupled to the control device, the control interface being adapted to receive input signals and the control device being controlled in accordance with the input signals to control the data generator to generate data, the data generated being dependent on the input signals.

In accordance with a second aspect of the present invention, a method of performing a built-in self test of a RAM on a logic device comprises generating input signals and coupling the input signals to a control apparatus for testing a RAM, the input signals causing the control apparatus to generate a test bit pattern which is dependent on the input signals, the generated test bit pattern being transmitted to the RAM for storage at an address in the RAM and subsequently reading a test bit pattern stored at the address and comparing the test bit pattern with the bit pattern read from the address.

In accordance with a third aspect of the present invention, there is provided a logic device comprising a RAM and control apparatus, the control apparatus being adapted to receive input signals from a processor, and the control apparatus being coupled to the RAM to send signals to the RAM in response to the input signals received, and wherein the control apparatus comprises a data generator, the data generator generating a test bit pattern which is dependent on the received input signals.

An advantage of the invention is that by including control apparatus with a data generator and a control interface, it is possible to control the data generator to generate different test bit patterns to test the random access memory.

Typically, the control apparatus further comprises an address generator and a control generator to generate address and control signals for the RAM.

In one example of the invention, the logic device also comprises the processor from which the control apparatus receives the input signals. However, it is possible that the processor may be external from the logic device.

Typically, the logic device may further comprises a register device which monitors signals sent to the RAM by the control apparatus and received from the RAM by the control apparatus. Typically, the register device is coupled to an output contact on the logic device to permit the register device to be monitored by an external device. Preferably, the register device is a signature register device and most preferably, is a multiple input signature register device (MISR).

Control apparatus in accordance with the invention will now be described with reference to the accompanying drawing, in which:

FIG. 1 is a block diagram of a RAM test controller.

FIG. 1 shows a RAM test controller 10 which includes a configuration and control interface 5 which receives an input 6 on a bus from a test processor (not shown), such as a microcontroller. The output from the interface 5 is coupled to a control generation and synchronizing device 1 which has outputs coupled to an address generator 2, a data generator 3 and a state machine 4. Outputs from the address generator 2 and the data generator 3 are also coupled to the state machine 4. The state machine 4 is coupled to a bus 7 which couples the test controller 10 to a random access memory (RAM) (not shown). In addition, the bus 7 is monitored by a multiple input signature register (MISR) 8 which is coupled to an output pin 9 of the logic device.

The test controller 10 is an integral part of a logic device which also includes a processor, such as a microcontroller, and the RAM.

In use, the test processor is coupled to the input bus 11 of the test controller 10. The test processor may be the processor located on the same logic device as the RAM and the test controller 10. However, alternatively, it is possible that the test processor may be an external processor which is coupled to the test controller 10 via input pins on the logic device.

The configuration and control interface 5 receives the input signals 6 from the test processor and couples the signals to the control generation and synchronizing block 1. The control generation and synchronizing block 1, in response to the input signals, generates the output 12 which are control instructions that are output to the state machine 4, the output 13 which are address generation instructions that are output to the address generator 2 and the output 14 which are data generation instructions that are output to the data generator 3. In response to the address generation instructions received from the control generation synchronizing block 1, the address generator 2 generates an address location of the RAM which is the output 15 to the state machine 4. Similarly, the data generator 3, in response to a data generation signal from the control generation and synchronizing block 1 generates a test bit pattern which is the output 16 to the state machine 4. The state machine 4 then outputs the test bit pattern, the address location and the control signal to the RAM.

The RAM receives the signals and stores the test bit pattern at the address specified by the address location.

Simultaneously, the MISR 8 monitors the signals to the RAM. Subsequently, the control generation and synchronizing block 1 will generate a read control signal to the state machine and the address generator 2 will generate the address at which the test bit pattern was stored. The state machine 4 will then output the read control signal and the address location to the RAM which will retrieve the bit pattern stored at the address location and send it on the bus 7 to the test controller 10. The bit pattern retrieved is recorded by the MISR 8. The contents of the MISR 8 are output on the output pin 9 of the logic device and the output pattern from the MISR is compared with a known reference pattern to give an indication of whether the RAM is operating correctly.

An advantage of the invention is that by using the data generator 3, it is possible to use the test processor to instruct the test controller 10 to generate a specific test bit pattern for a RAM. It is also possible to test the RAM using a number of different test bit patterns, if necessary, to ensure that the RAM has been comprehensively tested.

In addition, there is the advantage that as the test bit pattern generated by the test controller 10 is controlled by the test processor, the test bit pattern does not need to be known during design of the logic device and can be generated subsequently.

Furthermore, there is the advantage that as it is not necessary to permanently store the test bit pattern in the logic device, the test bit pattern can be changed at any time.

What is claimed is:

1. Control apparatus for testing a RAM, the apparatus comprising a control device coupled to an address generator, a data generator and a state machine, the state machine receiving outputs from the address generator, the data generator and the control device, and in response to the received outputs, outputting data, address and control signals, and a control interface coupled to the control device, the control interface being adapted to receive input signals and the control device being controlled in accordance with the input signals to control the data generator to generate data, the data generated being dependent on the input signals.

2. A logic device comprising a RAM and control apparatus, the control apparatus being adapted to receive input signals from a processor, and the control apparatus being adapted to be coupled to the RAM to send signals to the RAM in response to the input signals received, and wherein the control apparatus comprises a data generator, the data generator generating a test bit pattern which is dependent on the received input signals.

3. Apparatus according to claim 2, further comprising an address generator and a control generator to generate address and control signals for the RAM.

4. A device according to claim 2, wherein the logic device also comprises the processor from which the control apparatus receives the input signals.

5. A device according to claim 2, further comprising a register device which stores signals sent to the RAM by the control apparatus and signals received from the RAM by the control apparatus.

6. A device according to claim 5, wherein the register device is coupled to an output contact on the logic device to permit the contents of the register device to be monitored by an external device.

7. A device according to claim 5, wherein the register device is a signature register device.

8. A device according to claim 7, wherein the signature register device is a multiple input signature register device (MISR).

9. A method of performing a built-in self test of a RAM on a logic device, the method comprising generating input signals and coupling the input signals to a control apparatus for testing a RAM, the input signals causing the control apparatus to generate a test bit pattern which is dependent on the input signals, the generated test bit pattern being transmitted to the RAM for storage at an address in the RAM, and subsequently reading a test bit pattern stored at the address and comparing the test bit pattern with the bit pattern read from the address.

* * * * *